(12) United States Patent
Trauner et al.

(10) Patent No.: US 11,610,755 B2
(45) Date of Patent: Mar. 21, 2023

(54) METHOD OF AUTOMATICALLY FOCUSING A CHARGED PARTICLE BEAM ON A SURFACE REGION OF A SAMPLE, METHOD OF CALCULATING A CONVERGING SET OF SHARPNESS VALUES OF IMAGES OF A CHARGED PARTICLE BEAM DEVICE AND CHARGED PARTICLE BEAM DEVICE FOR IMAGING A SAMPLE

(71) Applicant: Applied Materials, Inc., Santa Clara, CA (US)

(72) Inventors: Robert Trauner, Pliening (DE); Bernhard Schüler, Munich (DE); Bernhard G. Mueller, Finsing (DE); Nikolai Knaub, Munich (DE); Kulpreet Singh Virdi, Munich (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/507,342

(22) Filed: Oct. 21, 2021

(65) Prior Publication Data
US 2022/0044907 A1 Feb. 10, 2022

Related U.S. Application Data

(63) Continuation of application No. 16/978,157, filed as application No. PCT/EP2019/059456 on Apr. 12, 2019, now Pat. No. 11,195,691.

(51) Int. Cl.
*H01J 37/22* (2006.01)
*G06T 7/00* (2017.01)
(Continued)

(52) U.S. Cl.
CPC .......... *H01J 37/222* (2013.01); *G06T 7/0004* (2013.01); *H01J 37/21* (2013.01);
(Continued)

(58) Field of Classification Search
CPC .... H01J 37/222; H01J 37/21; H01J 2237/216; H01L 21/67288; G06T 7/0004; G06T 2207/30148; G06T 2207/30168
See application file for complete search history.

(56) References Cited

U.S. PATENT DOCUMENTS

| 6,476,398 B1 | 11/2002 | Xu et al. |
| 7,109,485 B2 | 9/2006 | Takane et al. |
| 2019/0035596 A1 | 1/2019 | Takeuchi et al. |

FOREIGN PATENT DOCUMENTS

| CN | 101733547 A | 6/2010 |
| EP | 1511065 A1 | 3/2005 |
| WO | 2018/140903 A2 | 8/2018 |

OTHER PUBLICATIONS

Search Report for Chinese Application No. 201980095343.1 dated Mar. 18, 2022.
(Continued)

*Primary Examiner* — Nicole M Ippolito
*Assistant Examiner* — Hanway Chang
(74) *Attorney, Agent, or Firm* — Patterson + Sheridan, LLP

(57) ABSTRACT

A method of automatically focusing a charged particle beam on a surface region of a sample is provided. The method includes acquiring a plurality of images for a corresponding plurality of focusing strength values; calculating a plurality of sharpness values based on the plurality of images, the plurality of sharpness values are calculated with a sharpness function provided as a sum in a frequency space based on the plurality of images; and determining subsequent focusing strength values of the plurality of focusing strength values with a golden ratio search algorithm based one the calculated sharpness values.

22 Claims, 5 Drawing Sheets

(51) Int. Cl.
　　　*H01J 37/21*　　　(2006.01)
　　　*H01L 21/67*　　　(2006.01)
(52) U.S. Cl.
　　　CPC ............... *H01L 21/67288* (2013.01); *G06T 2207/30148* (2013.01); *G06T 2207/30168* (2013.01); *H01J 2237/216* (2013.01)

(56) References Cited

OTHER PUBLICATIONS

Office Action for Chinese Application No. 201980095343.1 dated Mar. 28, 2022.
International Search Report and Written Opinion, PCT/EP2019/059456, Jan. 3, 2020.
M Rudnaya: Automated Focusing and Astigmatism Correction in Electron Microscopy; PhD Thesis, Eindhoven University of Technology, Sep. 1, 2011.
M. Rudnaya_Assessing Sharpness Functions, Chapter 6, Sep. 1, 2011.
REF_Anonymous: "Sobel operator—Wikipedia", Feb. 1, 2019.
Office Action for Taiwan Application No. 109107896 dated May 13, 2021.
Search Report for Taiwan Application No. 109107896 dated May 12, 2021.
Office Action for Chinese Patent Application No. 2022032301041680, dated Mar. 28, 2022.

METHOD OF AUTOMATICALLY FOCUSING A CHARGED PARTICLE BEAM ON A SURFACE REGION OF A SAMPLE, METHOD OF CALCULATING A CONVERGING SET OF SHARPNESS VALUES OF IMAGES OF A CHARGED PARTICLE BEAM DEVICE AND CHARGED PARTICLE BEAM DEVICE FOR IMAGING A SAMPLE

CROSS-REFERENCE TO RELATED APPLICATIONS

This application is a continuation of U.S. application Ser. No. 16/978,157, filed Sep. 3, 2020, which is a national stage application filed under 35 U.S.C. § 371, of International Patent Application No. PCT/EP2019/059456, filed Apr. 12, 2019, each of which is hereby incorporated by reference in its entirety.

FIELD

The present disclosure relates to an autofocus of a charged particle beam on a specimen, for example, an electron beam on a sample. Particularly, the present disclosure relates to focusing a charged particle beam of a scanning charged particle beam device, such as for example a scanning electron microscope. Further, the present disclosure relates to a method of inspecting a sample with a charged particle beam device. In particular, a large-area substrate for display manufacturing which may have a non-planar surface or a substrate which might have a certain degree of elasticity or which may be not fully parallel is inspected. More particularly, embodiments described herein relate to methods and apparatuses for inspecting samples with a focused charged particle beam, particularly for at least one of imaging, reviewing, inspecting defects, and metrology of the sample. Yet further, a charged particle beam device for inspecting a sample is described.

BACKGROUND

In many applications, thin layers are deposited on a substrate, e.g. on a glass or a substrate, such as or a non-conductive substrate. The substrate is typically coated in a vacuum chamber of a coating apparatus. For some applications, the substrate is coated in a vacuum chamber using a vapor deposition technique. Over the last few years, the price of electronic devices and particularly opto-electronic devices has reduced significantly. Further, the pixel density in displays has increased. For TFT displays, a high density TFT integration is beneficial. In spite of the increased number of thin-film transistors (TFT) within a device, the yield is to be increased and the manufacturing costs are to be reduced further.

One or more structures or layers may be deposited on a substrate such as a glass substrate to form an array of electronic or optoelectronic devices such as TFTs on the substrate. A substrate with electronic or optoelectronic structures formed thereon is also referred to as a "sample" herein. During the manufacturing of TFT-displays and other samples, it may be beneficial to inspect one or more structures deposited on the sample to monitor the quality of the sample.

The inspection of the sample can, for example, be carried out by an optical system. However, the dimension of some of the features of the sample or the size of defects to be identified may be below the optical resolution, making some of the defects non-resolvable to the optical system. Charged particles such as electrons may be utilized for inspecting the surface of the sample which may provide a better resolution as compared to optical systems.

For inspecting and other imaging applications, particularly in display industry and for semiconductor industry, throughput is an important consideration. A proper focus of a convergent electron beam on a sample increases the quality of imaging and inspecting. Systems offer a semi-automated focus wherein an operator of the tool assists a focusing routine. Some autofocus concepts have been described for fully automated focusing of a beam on a specimen. The time used to autofocus the charged particle beam adds to the total time for imaging a region on the sample and, thus, decreases the throughput. This may be particularly relevant for imaging with a charged particle beam on a large area substrate, for high throughput applications on semiconductor wafers and glass based TFTs, such as for example, multi-beam inspection tools, for which a plurality of beamlets are focused on a sample.

Accordingly, there is a desire for improved focusing, particularly improved autofocusing of charged particle beam devices.

SUMMARY

In light of the above a method of automatically focusing a charged particle beam on a surface region of a sample, a method of calculating a converging set of sharpness values of images of a charged particle beam device, and a charged particle beam device for imaging a sample, particularly according to the independent claims are provided. Further aspects, advantages, and features are apparent from the dependent claims, the description, and the accompanying drawings.

According to one embodiment, a method of automatically focusing a charged particle beam on a surface region of a sample is provided. The method includes acquiring a first image for a first focusing strength value; calculating a first sharpness value based on the first image, the first sharpness value is calculated with a sharpness function; and determining second focusing strength value with a golden ratio search algorithm based on the calculated first sharpness value.

According to one embodiment, a method of automatically focusing a charged particle beam on a surface region of a sample is provided. The method includes acquiring a plurality of images for a corresponding plurality of focusing strength values; calculating a plurality of sharpness values based on the plurality of images, the plurality of sharpness values are calculated with a sharpness function; and determining subsequent focusing strength values of the plurality of focusing strength value with a golden ratio search algorithm based on the calculated sharpness values.

According to one embodiment, a method of calculating a converging set of sharpness values of images of a charged particle beam device is provided. The method includes providing a first focusing strength value and a second focusing strength value providing a first focusing strength range and providing a focusing strength accuracy as input parameters to a convergence algorithm; calculating a third focusing strength value and a fourth focusing strength value based on a golden ratio or Fibonacci numbers and depending on the first focusing strength value and the second focusing strength value; imaging a sample with the third focusing strength value and the forth focusing strength value to obtain images; calculating sharpness values from the images with a sharpness function; determining a second focusing strength range narrower than the first focusing strength range based on the sharpness values by iteratively replacing the first focusing strength value or the second focusing strength value with a neighboring focusing strength value selected from the third focusing strength value or the fourth focusing strength value and switching the third focusing strength value or the fourth focusing strength value; and iteratively imaging the sample to obtain further images and calculating sharpness values from the further images.

According to one embodiment, a charged particle beam device for imaging a sample is provided. The device includes a charged particle source configured to emit a charged particle beam; an objective lens configured to focus the charged particle beam propagating along an optical axis on the sample with a focusing strength value; and a controller configured to adjust the focusing strength value according to a method an embodiment of the present disclosure.

BRIEF DESCRIPTION OF THE DRAWINGS

A full and enabling disclosure to one of ordinary skill in the art is set forth in the remainder of the specification including reference to the accompanying drawings wherein.

DETAILED DESCRIPTION

Figure 1:
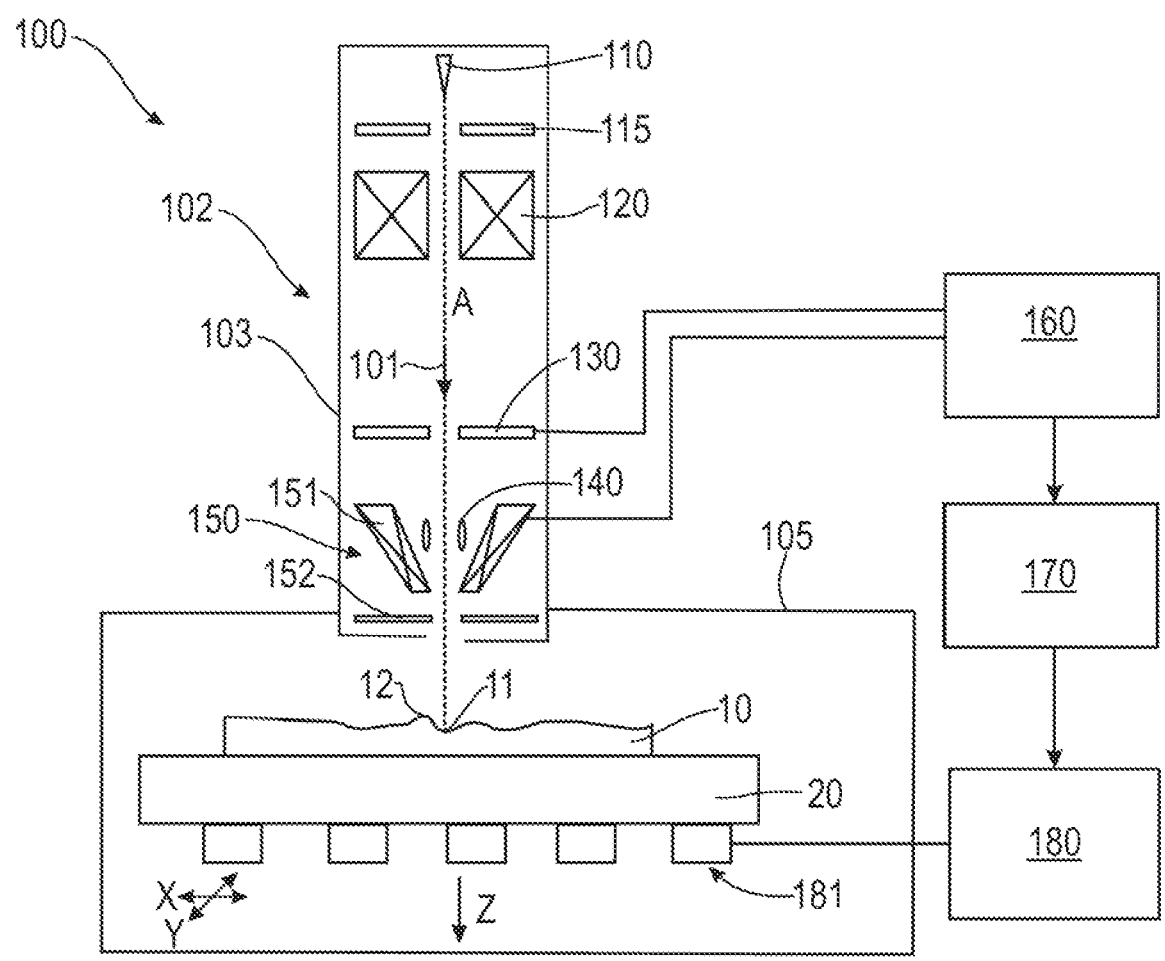
FIG. 1 shows a charged particle beam device configured to be operated according to methods described herein.

Reference will now be made in detail to exemplary embodiments, one or more examples of which are illustrated in the figures. Each example is provided by way of explanation and is not meant as a limitation. For example, features illustrated or described as part of one embodiment can be used on or in conjunction with other embodiments to yield yet further embodiments. The intention is that the present disclosure includes such modifications and variations.

Within the following description of the drawings, same reference numbers refer to same components. Only the differences with respect to the individual embodiments are described. The structures shown in the drawings are not necessarily depicted true to scale but rather serve the better understanding of the embodiments.

FIG. 1 shows a charged particle beam device 100 configured to be operated according to methods described herein. The charged particle beam device 100 may include a scanning electron microscope 102 with a beam source 110 configured to generate a charged particle beam 101, particularly an electron beam. The charged particle beam 101 can be directed along an optical axis A through a column 103 of the scanning electron microscope 102. An inner volume of the column 103 can be evacuated. The scanning electron microscope 102 may include beam influencing elements such as one or more beam deflectors, scan deflectors 140, accelerators 115, decelerators, lens elements 120 or other focusing or defocusing elements, beam correctors, beam separators, detectors and/or further elements provided for influencing the charged particle beam 101 propagating along the optical axis A.

The charged particle beam device 100 includes a stage 20 for arranging a sample 10 to be inspected thereon, and an objective lens 150 configured to focus the charged particle beam on the sample 10 arranged on the stage 20.

The stage 20 may be arranged in a sample inspection chamber 105 which can be evacuated in some embodiments. In some embodiments, the stage 20 may be a movable stage. In particular, the stage 20 may be movable in a plane perpendicular to the optical axis A of the charged particle beam device 100 (also referred to herein as X-Y-plane). By moving the stage 20 in the X-Y-plane, a specified surface region of the sample 10 is moved into an area below the scanning electron microscope 102, such that the specified surface region can be inspected by focusing the charged particle beam 101 thereon. For example, in FIG. 1, a first surface region 11 of the sample 10 is intersected by the optical axis A of the scanning electron microscope 102 such that the first surface region 11 can be inspected. As will be explained in more detail below, the stage 20 may also be movable in the Z-direction, i.e. in the direction of the optical axis A.

According to embodiments described herein, one or more surface regions of the sample 10 are inspected with the charged particle beam device 100. The term "sample" as used herein may relate to a substrate with one or more layers or features formed thereon. The sample may be inspected for one or more of (i) imaging a surface of the sample, (ii) measuring dimensions of one or more features of the sample, e.g. in a lateral direction, i.e. in the X-Y-plane, (iii) conducting critical dimension measurements and/or metrology, (iv) detecting defects, and/or (v) investigating the quality of the sample.

FIG. 1 further shows a surface region of the sample being at a different height as compared to the first surface region. Accordingly, the working distance (WD) between the objective lens and the surface region to be imaged is different for the second surface region as compared to the first surface region. A similar effect may occur in the event that the stage 20 is not exactly perpendicular to the optical axis A. Particularly for large area substrates of several m$^2$ surface area already a small deviation may result in different heights of the surface to be imaged at different sample positions. In Display industry, the height differences due to tolerances in stage and glass may result in the surface region to be inspected may differ by up to a few hundred μm in height from the predetermined working distance. A wide range of focus may, thus, be considered for an autofocus. Further, autofocus routines may be used more often.

Embodiments of the present disclosure provide a method of automated focusing a charged particle beam, such as an electron beam on surface region of a sample. Due to the increased speed of the autofocus of the disclosure, the time for focusing may be reduced, e.g. by 50% to 70% in certain cases. Accordingly, the throughput can be significantly increased, e.g. double, for an automated scanning electron microscope (SEM). Additionally or alternatively, the success rate of the autofocus can be increased. Operation of an SEM can be provided with improved reliability, for example also with noisy images.

Embodiments of the present disclosure provide an autofocus, wherein images under a plurality of focus conditions are measured. From a measured image a sharpness parameter is calculated. The sharpness parameter is optimized using a convergence algorithm. The sharpness parameter includes a transformation of the acquired image and a filtering. A golden ratio convergence algorithm, for example, a Fibonacci convergence algorithm is applied.

For autofocus of SEMs, golden ratio convergence algorithms have been discussed in the past in light of the options to provide a fast convergence. Yet, in the absence of a proper sharpness function, the convergence algorithm may fail quite frequently, i.e. the success rate of the autofocus is low. In advanced manufacturing technology, especially for the semiconductor and display manufacturing, an SEM beneficially perform focusing operations autonomously to support inspection systems, for example, an electron beam inspection (EBI) tool, metrology system, or review systems, for example for electron beam review (EBR), 24 hours a day, 7 days a week with high success and as a further aspect at a fast rate. The time to focus the beam is a parameter for enhancing the throughput of such systems. Accordingly, it is beneficial to provide an autofocus with a good success rate and having a short focusing time. Embodiments of the present disclosure provide a combination of sharpness function and convergence algorithm and may, thus, provide both advantages.

As is schematically depicted in FIG. 1, the sample 10 may include a first surface region 11 that is provided at a first level and a second surface region 12 laterally spaced from the first surface region 11 that is provided at a second level. In other words, the height of the first surface region 11 differs from the height of the second surface region 12 relative to a plane of the objective lens 150. In some embodiments, the sample (which may have a planar or a non-planar sample surface) may be arranged on the stage 20, wherein the stage 20 has tolerances or non-planar stage surface. Accordingly, when the sample 10 is arranged on the stage, the sample may also have a first surface region 11 and a second surface region 12 which are arranged at different levels. The "level" of a surface region of a sample that is arranged on the stage may refer to a height of the surface region in the direction of the optical axis A, i.e. relative to a plane of the objective lens 150.

For imaging a sample with the charged particle beam 101, the charged particle beam is typically focused on the sample surface with the objective lens 150. Secondary electrons or backscattered electrons (both may be referred to as "signal electrons") are generated when the charged particle beam 101 impinges on the sample surface. The signal electrons provide information inter alia on spatial characteristics and dimensions of features of the sample surface and are detected with a detector 130. By scanning the charged particle beam 101 over the sample surface, e.g. with scan deflectors 140, and detecting the signal electrons as a function of generation position of the signal electrons, the sample surface or a portion thereof can be imaged. In some embodiments, one or more scan deflectors 140 may be provided for scanning the charged particle beam 101 over the surface of the sample, e.g. in the X-direction and/or in the Y-direction.

A reduction of the spot size of the focused charged particle beam on the sample surface increases the obtainable image resolution. Accordingly, the sample surface is beneficially arranged in the plane of focus of the objective lens during inspection. The distance between the downstream end of the objective lens 150 and the plane of focus of the charged particle beam where the sample surface is to be arranged is typically referred to as the "working distance" of the charged particle beam device 100.

According to embodiments of the present disclosure the focus of a charged particle beam device on a sample is adjusted. According to embodiments described herein, the objective lens may include a magnetic lens component 151 with one or more coils. A focusing strength can be adapted by varying the focusing current in the one or more coils. Additionally or alternatively, an objective lens may include an electrostatic lens component. Accordingly, a focusing strength can additionally be adapted by varying relative potentials in the column. For example, electrodes of the electrostatic lens component can be biased to varying potentials to vary the focusing effect and/or the sample can be biased to a varying potential to vary the focusing strength. Yet further, the beam energy in the column can be adapted, e.g. by biasing the source and/or electrodes to varying potentials. The beam energy may also influence the focusing strength of the objective lens on the sample. Yet further, additionally or alternatively, the stage can be moved to change the distance to the objective lens. Accordingly, the surface region to be imaged can be varied in height (Z-direction) to be either in focus or out of focus. However, as explained below in more detail, the working distance also affects other imaging characteristics, such that embodiments of the present disclosure, which can be combined other embodiments described herein, beneficially adjust the focusing strength and the working distance (WD).

Figures 2A, 2B, 2C:
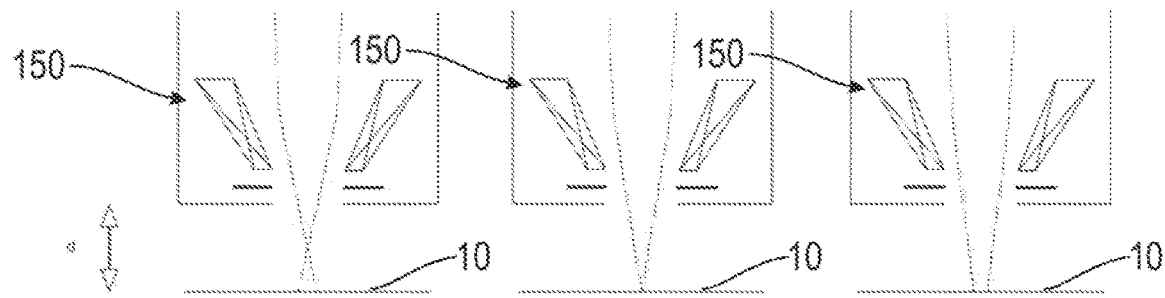
FIGS. 2A to 2C show a charged particle beam device in different focus conditions to illustrate embodiments of the present disclosure.

FIG. 2A shows an objective lens 150 and a sample 10 at a working distance d, wherein the charged particle beam is overfocused. The focusing strength of the objective lens may be adapted depending on a local height of the surface region to be imaged. For example, the focusing strength of the objective lens may be decreased by decreasing the focusing current FC applied to the one or more coils (increasing the focusing distance). FIG. 2C shows an objective lens 150 and a sample 10 at a working distance d, wherein the charged particle beam is underfocused. The focusing strength of the objective lens may be increased by increasing the focusing current which is applied to the one or more coils of the magnetic lens component 151 (decreasing the focusing distance). In addition to or alternative to the focusing current, one or more of the other above-described parameters may be varied to adjust the focusing strength. FIG. 2B shows an objective lens and a sample having schematically an optimum focus for the working distance D.

Figures 3A, 3B, 3C:
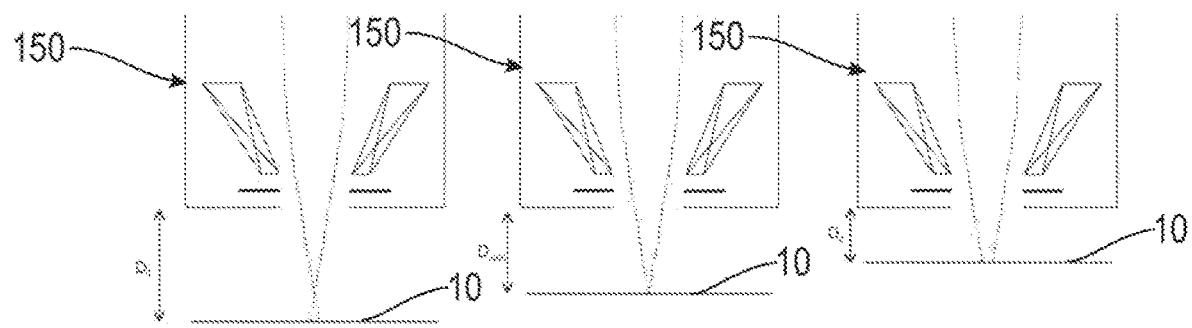
FIGS. 3A to 3C show a charged particle beam device in different working distance conditions to illustrate embodiments of the present disclosure.

FIG. 3A shows a situation with a first WD, wherein the beam is overfocused, i.e. the surface region of the sample is too low. FIG. 3C shows a situation with a WD, wherein the beam is underfocused, i.e. the surface region is too height. FIG. 3B shows a situation with a WD, wherein schematically an optimum focus is shown.

Calibrations performed during the start-up or service of the charged particle beam device 100 are valid only for a certain range of focusing strength. A strong variation of the focusing strength of the objective lens due to sample surface not being at the appropriate distance therefore negatively affects the measurement accuracy. The calibrations are typically performed in a predetermined plane of focus. A given scan current of a scan deflector 140 is applied for imaging the calibration object with the known dimension. Using the correlation with the size of this known calibration object located at the predetermined working distance, allows for calculating the scan current corresponding to a given size of the image, also known as the "field of view" (FOV). Accordingly, the scan current appropriate for any given FOV can be determined. When the height of a sample changes by an unknown value, and an FOV is chosen to image the sample, inaccuracies arise. In particular, the used scan current results in an FOV which is not the actual FOV of a region of the sample which does not lie in the predetermined plane of focus where the calibration was performed.

In this context, it is noted that for a charged particle beam with a high landing energy on the sample, the above-described measurement error may be comparably low. However, when using a charged particle beam with a low landing energy, the measurement error may become significant, e.g. in case of an electron beam with a landing energy of 1 keV or less. Accordingly, measurement errors may become significant in the case of a charged particle beam device including a low voltage SEM (LV-SEM).

Low energy electron beams are beneficial for the inspection of glass samples or other non-conductive samples. However, low-energy electron beams are more sensitive to height variations of the sample surface.

Accordingly, it is beneficial that the point of focus of a charged particle beam device is controlled such that the sample surface to be investigated stays close to the predetermined plane of focus where the calibration measurements were previously performed. The charged particle beam device can, therefore, be operated with a high accuracy and reduced measurement errors.

A method of imaging a sample 10 (see e.g. FIG. 1) described herein includes arranging the sample 10 on the stage 20. The sample 10 includes a first surface region 11 that is to be inspected with the charged particle beam device 100. The first surface region 11 is arranged at an (initially unknown) first distance from the objective lens 150. Since the first distance D1 from the objective lens 150 to the first surface region 11 is not initially known, the first surface region 11 may not be positioned in a plane of focus of the objective lens. Further, the first surface region 11 may not be positioned at the predetermined working distance from the objective lens 150. A first focusing strength of the objective lens is determined, wherein the first focusing strength is adapted to focus the charged particle beam 101 on the first surface region 11 of the sample. A sharp image of the first surface region 11 may be obtainable by focusing the charged particle beam 101 on the first surface region 11 with the first focusing strength. However, the first surface region 11 may not be arranged at the predetermined working distance where the calibration measurements were previously performed. A difference between the first distance and the predetermined working distance can be calculated based on the determined first focusing strength. The distance between the first surface region 11 and the objective lens 150 can then be adjusted by the calculated difference. After adjusting the distance, the first surface region 11 is essentially arranged at the predetermined working distance WD from the objective lens 150 where the calibration measurements were previously performed. Accordingly, accurate measurements of dimensions of the sample surface can be conducted. FIG. 1 schematically shows an adjusting unit 180 which receives the calculated difference and adjusts the distance between the first surface region 11 and the objective lens 150, e.g. by moving the stage 20 in the direction of the optical axis A.

According to embodiments of the present disclosure, a sample 10 may include an inflexible substrate, e.g., a glass substrate, a glass plate, or a semiconductor wafer, or a flexible substrate, such as a flexible glass or a web or a foil. The sample may be a coated substrate, wherein one or more thin material layers or other features are deposited on the substrate, for example by a physical vapor deposition (PVD) process or a chemical vapor deposition process (CVD). In particular, the sample may be a substrate for display manufacturing having a plurality of electronic or optoelectronic devices formed thereon. Large area substrates for display manufacturing may benefit from the autofocus of embodiments described herein, due to larger positioning tolerances of the large area substrates. The electronic or optoelectronic devices formed on the substrate are typically thin film devices including a stack of thin layers. For example, the sample may be a substrate with an array of thin film transistors (TFTs) formed thereon, e.g. a thin film transistor based substrate. Further, the sample, may be a semiconductor wafer. For example, for an inspecting application high throughput is beneficial and, for example, multi-beam applications may also particularly benefit from the autofocus of embodiments described herein.

According to some embodiments, the sample may include a large-area substrate having a size of at least 1 m$^2$. The size may be from about 1.375 m$^2$ (1100 mm×1250 mm—GEN 5) to about 9 m$^2$, more specifically from about 2 m$^2$ to about 9 m$^2$ or even up to 12 m$^2$. For instance, a substrate can be GEN 7.5, which corresponds to a surface area of about 4.39 m$^2$ (1.95 m×2.25 m), GEN 8.5, which corresponds to a surface area of about 5.7 m$^2$ (2.2 m×2.5 m), or even GEN 10, which corresponds to a surface area of about 9 m$^2$ (2.88 m×3130 m). Even larger generations such as GEN 11 and GEN 12 can be implemented.

According to embodiments of the present disclosure, for a charged particle beam device inter alia the focusing strength of the objective lens control the convergence of the charged particle beam on the surface of the sample. For embodiments described herein, a charged particle beam can be an electron beam, for example, an electron beam of an SEM. The focus condition is defined by the focusing strength of the charged particle beam device and the working distance. For example, both the working distance and the focusing strength can be adjusted. In particular, a first focusing strength can be adjusted for a first working distance. From the first focusing strength, a second focusing strength and a second working distance can be determined. According to some embodiments, which can be combined with other embodiments described herein, the second working distance is the working distance utilized for a previous calibration of the charged particle beam device.

Embodiments of the present disclosure provide an autofocus method, which is fully automated, i.e. irrespective of the skill level of an operator, to determine a focusing strength of a charged particle beam device for a given working distance. The focusing strength may be adjusted by the objective lens excitation or another parameter described above and provides improved imaging, e.g. an optimum focus on a surface region of a sample.

The method for adapting the focusing strength of the charged particle beam device includes acquiring a first image with a first focusing strength. According to some embodiments of the present disclosure, which can be combined with other embodiments described herein, an image may include one or more frames at the surface region of the sample. A first sharpness value is calculated from the first image with a sharpness function. A second image is acquired with a second focusing strength. A second sharpness value is calculated from the second image with the sharpness function. Iteratively, further images with further focusing strength may be acquired. At least a third image resulting in at least a third sharpness value is acquired. The further focusing strengths are calculated from the previous sharpness values, particularly the last sharpness value or the last two sharpness values, wherein a convergence algorithm is utilized.

According to embodiments of the present disclosure, the convergence algorithm can be a golden ratio search function. A maximum of a unimodal function, i.e. the sharpness value as a function of the focusing strength, is determined. The golden ratio search determines a range in which the maximum lies between a first focusing strength value and a second focusing strength value and selecting a subsequent focusing strength value, i.e. third focusing strength value, such that the triplet of focusing strength values have differences of a golden ratio (1.61803). The triplet is probed with a fourth focusing strength value again providing a golden ratio. Depending on the fourth sharpness value, it can be determined which part of the range of focusing strength values can be discarded, i.e. the range of focusing strength values to determine the maximum is narrow.

Figure 4A:
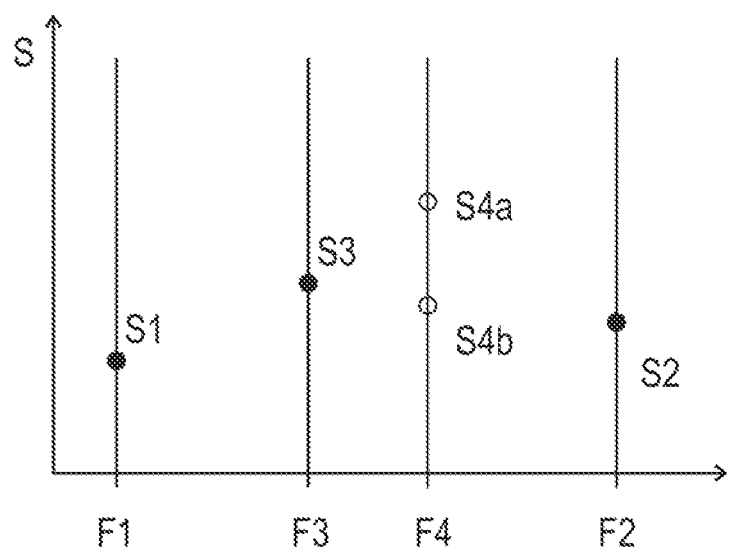
FIG. 4A is a diagram illustrating a convergence algorithm according to embodiments of the present disclosure.
Figure 4B:
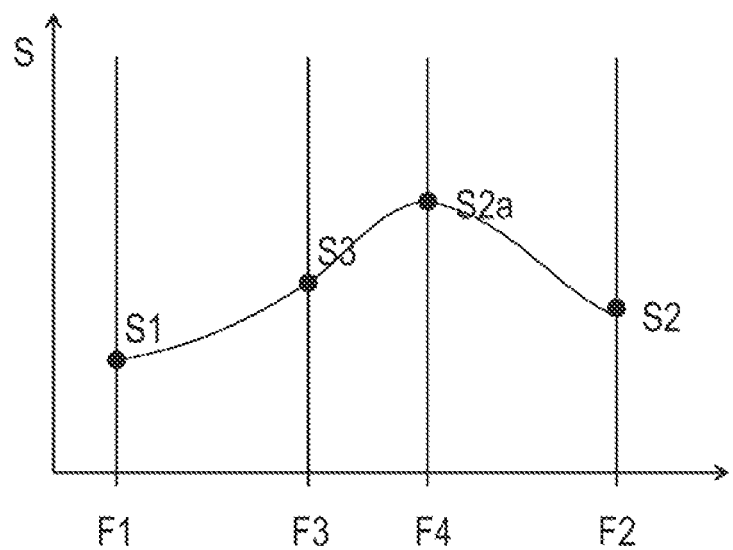
FIG. 4B shows an exemplary sharpness function that may correspond to the diagram of FIG. 4A.

This may be exemplarily seen in FIGS. 4A and 4B. FIG. 4A shows a lower focusing strength value F1 and an upper focusing strength value F2. A third focusing strength value F3 is between F1 and F2, wherein a golden ratio is provided for a difference of F1 and F3 vs the difference of F2 and F3. Each focusing strength value has a corresponding sharpness value S1 to S3. A fourth focusing strength value F4 provides a golden ratio for a difference between F3 and F4 vs. F4 and F2. In the event that the probing focusing strength value F4 would result in a sharpness value S4a as shown in FIG. 4A it is clear for a unimodal function that the maximum would be between F3 and F2. In the event the probing focusing strength value F4 would result in a sharpness value S4b as shown in FIG. 4A it is clear for a unimodal function that the maximum would be between F1 and F4. Accordingly, in both cases, the search interval is narrowed and the convergence algorithm can continue with a further focusing strength value again providing a golden ratio. An exemplary sharpness function is shown in FIG. 4B. By evaluating the sharpness of successively acquired images the algorithm proceeds towards convergence.

According to yet further embodiments, which can be combined with other embodiments described herein, a similar search can be provided as a Fibonacci search, wherein the length of the intervals, e.g. F1-F2 or F2-F3, is provided by a calculation based on Fibonacci numbers.

Such convergence algorithms can provide a fast convergence. Yet, for a majority of sharpness functions, the success rate is low as there will not be a correct convergence sharpness value of the algorithm in the event the correct interval is erroneously discarded for one probing step, i.e. the interval including the maximum is discarded. Embodiments of the present disclosure utilize a golden ratio search or golden section search, such as a Fibonacci search, for automated focusing of a charged particle beam device. For a charged particle beam device the signal to noise ratio is lower as compared to, for example, light optical systems. Accordingly, the success rate may be significantly lower for a charged particle beam device as compared to a light optical system.

Embodiments of the present disclosure provide a combination of a golden ratio search and a sharpness function, wherein the sharpness function is adapted to both provide a good success rate and a fast convergence. According to some embodiments, which can be combined with other embodiments described herein, the sharpness function is asymmetric. In the example shown in FIG. 4A, one of the sharpness values of the interval, i.e. S1 and S2, is higher than the other sharpness value. The asymmetry of the sharpness function, particularly the asymmetry for the starting focusing values increases the success rate. According to yet further embodiments, which can be combined with other embodiments described herein, the slope of the sharpness function is high and is close to zero only in a narrow range around the maximum of the sharpness function.

The speed of convergence of the autofocus depends on both, the sharpness function and the convergence algorithm. Embodiments provide a nimble autofocus, wherein a golden ratio search and a sharpness function with the above described characteristics are combined. The autofocus mechanism is provided for charged particle beam systems. This may be charged particle beam systems such as low voltage SEMs.

According to some embodiments, which can be combined with other embodiments described herein, the sharpness function can be an image derivative sharpness function. The plurality of images can be greyscale images $f_{i,j}$. A sharpness S can be calculated by $$S = \frac{1}{2}\left(k\sum_{i,j}|f_{i,j} - f_{i,j+v}|^p + l\sum_{i,j}|f_{i,j} - f_{i+u,j}|^q\right)$$

For the sharpness function S, p and q are rational numbers $\geq 1$. k and l are rational numbers within the interval [0,1]. v and u are horizontal and vertical steps in the image $f_{i,j}$.

According to yet further embodiments, which can be combined with other embodiments described herein, a sharpness function can be based on a Sobel operator edge detection. For example, edges in an image can be detected and a sharpness function S may be calculated by $$S = \sum_{i,j}\left[(f_{i,j} * S_1)_{i,j}^2 + (f_{i,j} * S_2)_{i,j}^2\right]$$

wherein $S_1$ and $S_2$ are Sobel operators as follows:

$$S_1 = \begin{bmatrix} -1 & 0 & 1 \\ -2 & 0 & 2 \\ -1 & 0 & 1 \end{bmatrix} \text{ and } S_2 = \begin{bmatrix} 1 & 2 & 1 \\ 0 & 0 & 0 \\ -1 & -2 & -1 \end{bmatrix}$$

and "*" denotes a discrete convolution.

According to yet further embodiments, a sharpness function S may be based on a Fourier transform. A Fourier transform sharpness functions may utilize that the magnitudes of certain frequencies in an image with a good focus is higher than magnitudes of certain frequencies in an image with not as good focus.

For example, a sharpness value may be based on a Fourier transform evaluating the frequencies of the images transformed in the frequency space. According to some embodiments, a sharpness function may be defined as a sum of a function of a filtered Fourier transform of an image, particularly a bandpass filtered discrete Fourier transform G (k,l) of an image.

$$S = \frac{1}{NM} \sum_{k=0}^{N-1} \sum_{l=0}^{M-1} |G(k,l)|$$

According to some embodiments, which can be combined with other embodiments, described herein, the function on which the sum is applied can be a sum of absolute values of the filtered Fourier transform, a sum of squared values of the filter Fourier transform or another function of the filter transform values, such as a distance function from the origin of the frequency space. As another example, an averaged sum of moduli of a filtered Fourier transform, i.e. a counting function of values applicable to the filter function may be used.

In some embodiments, the sharpness function based on Fourier transform can be computed by using a limited range Discrete Fourier transform. For example, a band pass filter may be omitted, wherein the Fourier Transform G(k,l) is computed in a predetermined range spanning $\Delta k$ and $\Delta l$ beginning at k1 and l1 along the two axes of the Fourier space respectively.

$$S = \frac{1}{\Delta k \Delta l} \sum_{k=k1}^{k1+\Delta k} \sum_{l=l1}^{l1+\Delta l} |G(k,l)|$$

According to yet further embodiments, a sharpness function may be based on a Scharr operator edge detection. The Sharpness of a Scharr operator edge detector can be:

$$S = \sum_{i,j} \left[ (f_{i,j} * S_{ch1})_{i,j}^2 + (f_{i,j} * S_{ch2})_{i,j}^2 \right]$$

wherein $S_{ch1}$ and $S_{ch2}$ are Scharr operators as follows:

$$S_{ch1} = \begin{bmatrix} 47 & 0 & -47 \\ 162 & 0 & -162 \\ 47 & 0 & -47 \end{bmatrix} \text{ and } S_{ch2} = \begin{bmatrix} 47 & 162 & 47 \\ 0 & 0 & 0 \\ -47 & -167 & -47 \end{bmatrix}$$

and "*" denotes a discrete convolution.

The above described sharpness functions, in combination with a golden ratio search algorithm allow for a faster autofocus with a high success rate. According to some embodiments, a method of automatically focusing a charged particle beam on a surface region of a sample is provided. The method includes acquiring a plurality of images for a corresponding plurality of focusing strength values; calculating a plurality of sharpness values based on the plurality of images, the plurality of sharpness values are calculated with a sharpness function; and determining subsequent focusing strength values of the plurality of focusing strength value with a golden ratio search algorithm based on the calculated sharpness values. The sharpness function can be selected from the group consisting of: a sharpness function based on an image derivative sharpness based on plurality of images, a sharpness function based on a sum in a frequency space, for example, as a limited range Discrete Fourier transform, a sharpness function is based on Sobel operator edge detector, and a sharpness function is based on Scharr operator edge detector.

Figure 5:
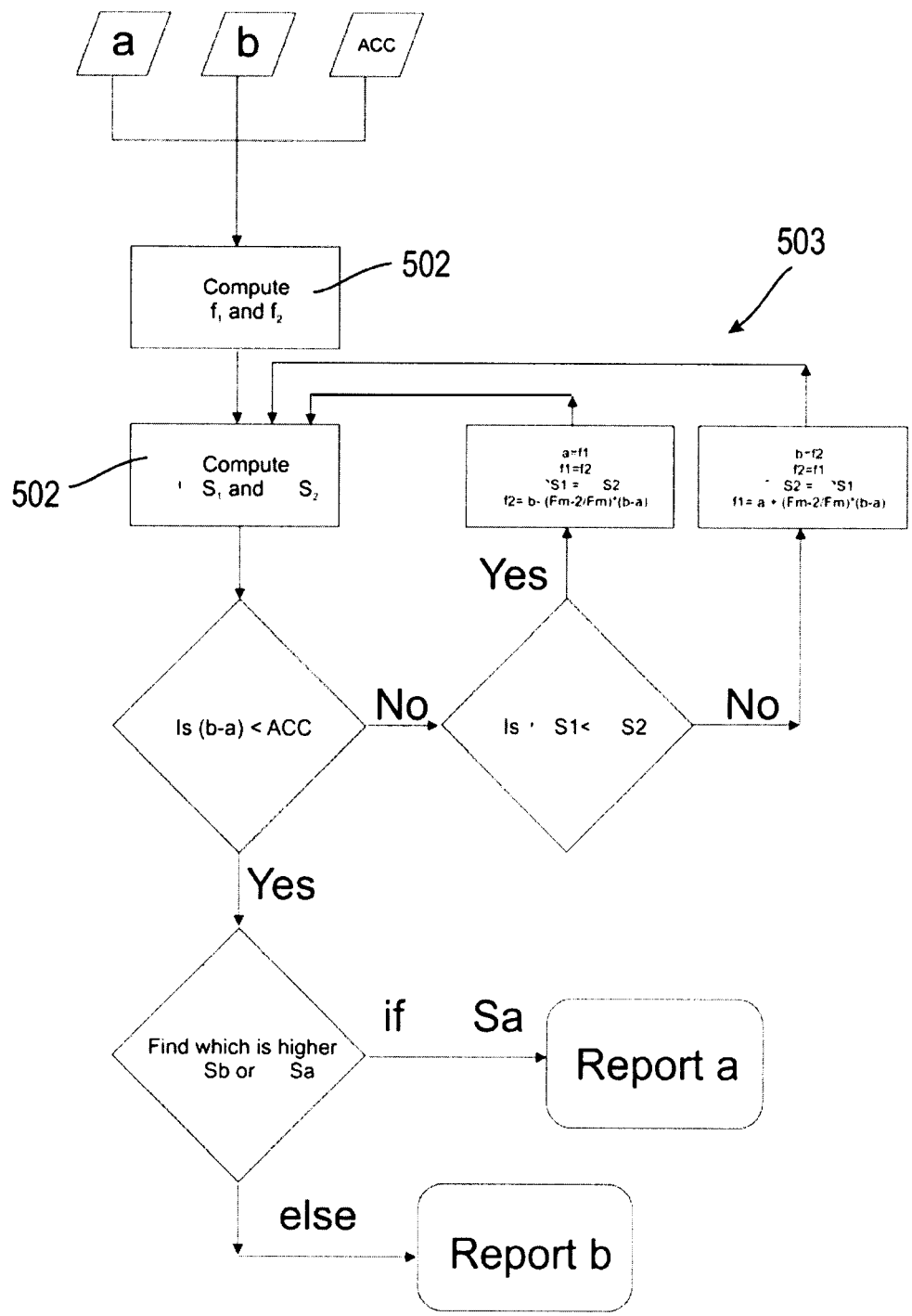
FIG. 5 shows a flow chart illustrating embodiments of convergence algorithms according to the present disclosure.

FIG. 5 shows a flow chart illustrating a method of calculating a convergence algorithm for a sharpness function, particularly an above-described sharpness function. A lower limit a of a focusing strength, an upper limit of b of the focusing strength and an accuracy level ACC of the focusing strength is provided for the algorithm. For example, the focusing strength can be an objective lens excitation. These input parameters a, b, and ACC can be provided based on the conditions of the application, for which the charged particle beam device, e.g. an SEM, is operated.

Due to the fact that the convergence algorithm is a golden ratio search, such as a Fibonacci search, the number of iterative steps is predetermined. The golden ratio determines the number of iterative steps to arrive at ACC for a given starting interval [a,b]. For example, the number of iterative steps is based on the order of the smallest Fibonacci number that is smaller than 2(b−a)/ACC. At operation 501, two focusing strength values f1 and f2 are calculated between a and b based in a golden ratio, such as based on Fibonacci numbers. From the images with focusing strength values f1 and f2, the sharpness values S2 and S2 are calculated at operation 502. The iterations narrowing the range between the focusing strength values is provided as shown in FIG. 5 at operation 503 and as generally described with respect to FIG. 4A. After the range of focusing strength values, i.e. the interval between two focusing strength values has narrowed below the predetermined accuracy ACC of the focusing strength vale, the focusing strength value providing the higher value of the sharpness function is reported.

In embodiments using Fibonacci, numbers for golden ratios as shown in FIG. 5, m can be the highest order of Fibonacci number at an iteration step, such that m would be between 3 and (S−1), wherein (S−1) is the number of iterative steps.

According to an embodiment of the present disclosure, a method of calculating a converging set of sharpness values of images of a charged particle beam device is provided. The method includes providing a first focusing strength value and a second focusing strength value providing a first focusing strength range and providing a focusing strength accuracy as input parameters to a convergence algorithm. The method further includes calculating a third focusing strength value and a fourth focusing strength value based on a golden ratio or Fibonacci numbers and depending on the first focusing strength value and the second focusing strength value and imaging a sample with the third focusing strength value and the forth focusing strength value to obtain images. Sharpness values are calculated from the images with a sharpness function, the sharpness function provided as a sum in a frequency space. A second focusing strength range narrower than the first focusing strength range is determined based on the sharpness values by iteratively replacing the first focusing strength value or the second focusing strength value with a neighboring focusing strength value selected from the third focusing strength value or the fourth focusing strength value and switching the third focusing strength value or the fourth focusing strength value. The method further includes iteratively imaging the sample to obtain further images and calculating sharpness values from the further images. For example, the first focusing strength value or the second strength value can be provided based on the sharpness values as an output after a predetermined number of iterations.

Figure 6:
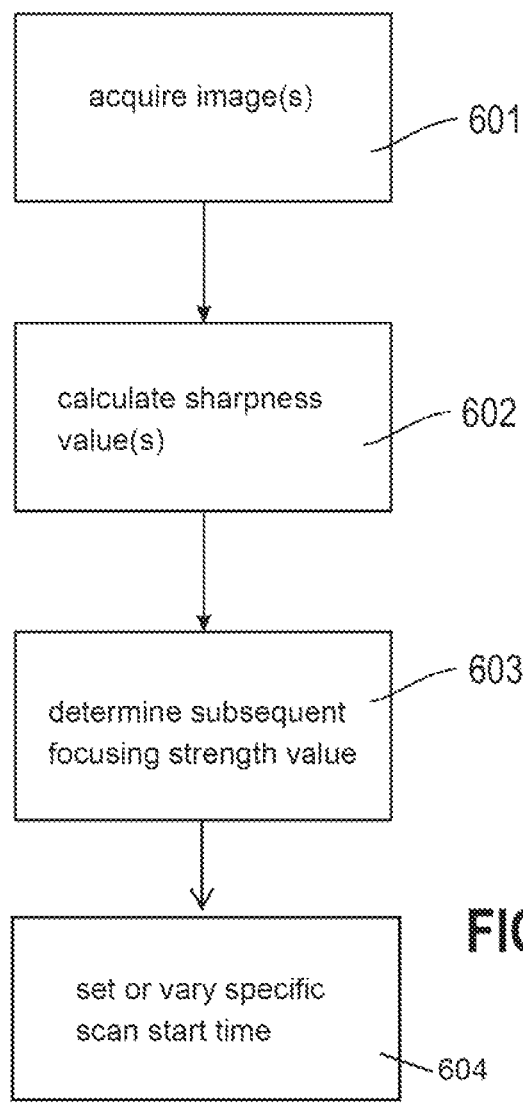
FIG. 6 shows a flow chart illustrating methods of automatically focusing a charged particle beam according to embodiments described herein.

FIG. 6 shows a flow chart illustrating embodiments of methods of automatically focusing a charged particle beam on a surface region of a sample. At operation 601, a plurality of images are acquired for a corresponding plurality of focusing strength values. A plurality of sharpness values are calculated based on the plurality of images at operation 602, the plurality of sharpness values are calculated with a sharpness function provided as, for example, a sum in a frequency space. At operation 603, subsequent focusing strength values of the plurality of focusing strength values are determined with a golden ratio search algorithm based one the calculated sharpness values. At operation 604, e.g. a scan starter unit of the processing unit 160 and/or a control unit determines and starts the scan to acquire the next image at predetermined time.

As described above, according to some embodiments, the sharpness function may calculate a sharpness value based on a Fourier transform of an image. For example, the sharpness value can be based on a discrete Fourier transform of the image. Yet further, the Fourier transform may particularly be filtered with a filter in the frequency space, for example, a bandpass filter.

As described above, the combination of a golden ratio search algorithm and a sharpness function may provide improved success rate and improved speed, particularly wherein the slope of the sharpness functions is high besides a close vicinity of the maximum of the sharpness function. According to some embodiments, which can be combined with other embodiments described herein, the convergence algorithm may include a number of iterations that is predetermined by a starting range of focusing strength values and a focusing strength accuracy. Yet further, additional or alternative modifications of embodiments described herein include focusing strength values that are provided by one or more parameters of a charged particle beam device, for example, a excitation current of a magnetic lens component, a potential of an electrostatic lens component, a potential of an emitter tip of a charged particle beam source, a potential of the sample, a potential of another portion of the charged particle beam column, an excitation of a further lens, such as a condenser lens, and/or a working distance.

In light of the above, a nimble autofocus can be provided for electron microscopy. For example, some embodiments provide a band pass filtered discrete Fourier transform based convergence using golden ratios. The embodiments may be provided for electron microscopy in general, and SEMs in particular. The time to automatically focus the beam is significantly reduced, e.g. by 50%. Accordingly, the throughput can be increased and the tact time can be decreased for an automated SEM based inspection tool, an SEM based review tool, or an SEM based metrology tool as used, for example, in display and semiconductor manufacturing.

Further, as described above with respect to FIGS. 3A to 3C, the working distance and the focusing can be adapted for proper imaging conditions. The relation between the focusing strength and the focusing distance can be previously determined, e.g. on an appropriate test location and setting a specified working point, by varying the focusing distance in steps, e.g. by utilizing a calibration object having a plurality of regions arranged on known levels. A table or function can be created that assigns a plurality of focusing strengths to corresponding focusing distances. By interpolation, the focusing distance as a monotonic function of the focusing current (or another focusing strength value) can be obtained at the specified working point. Adjusting the working distance can be particularly useful for low energy SEMs, i.e. SEMs with a low landing energy of the electrons.

In some embodiments, which may be combined with other embodiments described herein, the charged particle beam 101 impinges on the sample with a landing energy of 5 keV or less, particularly 1 keV or less. For example, the objective lens 150 may include a retarding field component 152 configured to decelerate the charged particle beam 101 to a landing energy of 5 keV or less. The retarding field component may include a retarding electrode. In particular, the charged particle beam device 100 may include a low voltage SEM (LV-SEM).

Low energy charged particle beams, particularly low-energy electron beams, do not penetrate deeply into the sample and may therefore provide superior high-quality information about the features on the sample surface. In particular, an advantage of having a landing energy of 5 keV or below, particularly a landing energy of 2 keV or below, is that the electron beam impinging onto the sample generates a stronger signal compared to high-energy electron beams. Since layers, e.g. LTPS layers, deposited on the substrate are thin and since high-energy electrons penetrate deeper into the sample, i.e. below the layer, only a few high-energy electrons may generate a detector signal that contains information about the surface layer. In contrast, low-energy electrons, such as electrons having a landing energy of 2 keV or 1 keV or below, penetrate into a shallow region of the sample only and thus provide more information about the surface layer. Accordingly, an improved image of e.g. grain boundaries may be provided even when, as provided by embodiments described herein, no surface etching of the substrate is carried out.

According to embodiments, which may be combined with other embodiments described herein, a plurality of surface regions of the sample 10 may be subsequently imaged. For example, the first surface region 11 of the sample 10 of FIG. 1 is inspected first, and the second surface region 12 of the sample 10 that has a higher level is inspected afterwards. The surface profile of the sample 10 may not be previously known such that, in order to obtain high-accuracy measurements, the stage position and/or the focusing strength value may need to be adjusted in real time, in the course of a partially or entirely automated measurement program, before the inspection of each of the plurality of surface regions. Embodiments of autofocus (automated focus) as described herein, wherein the methods may particularly operate without operator, may reduce the time for the focusing and may, thus, increase the throughput, particularly at a high success rate.

FIG. 1 shows a charged particle beam device 100 for inspecting a sample according to embodiments described herein in a schematic view. The charged particle beam device includes a stage 20 for arranging a sample to be inspected, and an objective lens 150 configured to focus a charged particle beam 101 propagating along an optical axis A on the sample 10. The charged particle beam device 100 further includes a processing unit 160, a calculation unit 170, and an adjusting unit 180.

The processing unit 160 and/or a control unit is configured to determine, for example, focusing strength values, e.g. of the objective lens 150 adapted to focus the charged particle beam 101 on the first surface region 11 of a sample 10. In some implementation, the processing unit 160 may include an image acquisition and analyzing unit. The processing unit 160 may be connected to the objective lens 150, a detector 130, and the scan deflectors 140 of the charged particle beam device 100. Accordingly, e.g. the focusing current FC of the objective lens may be controlled. The processing unit 160 may obtain images of the first surface region 11 by starting scanning using the scan deflectors 140 at the appropriate predetermined time and varying the focusing strength values of the charged particle beam device, e.g. the objective lens 150, and may analyze the obtained images. A waiting time between scans or a starting time of a scan can improve the autofocus speed and quality and can be adapted, e.g. by an operator, to improve the autofocus.

The calculation unit 170 may be configured to calculate a convergence algorithm according to embodiments of the present disclosure. The calculation unit may also be included in the processing unit.

The adjusting unit 180 may be configured to adjust a distance between a surface region of the sample and the objective lens. In some implementations, the adjusting unit 180 includes a stage motion controller 181 configured to move the stage 20 in the direction of the optical axis A, i.e. in the Z-direction. In some embodiments, the stage 20 may further be movable in the X-Y-plane, i.e. perpendicular to the optical axis A.

The stage 20 may be configured for supporting a large-area substrate for display manufacturing, particularly having a size of 1 m$^2$ or more. In particular, the stage 20 may have a stage surface for supporting a sample with a surface area of 1 m$^2$ or more. Large stage surfaces are typically not perfectly planar. For example, the stage surface may have local deviations from a perfectly planar surface in the range of several tens of microns. When a large-area sample is placed on the stage surface, the non-planarity of the substrate support surface may affect the height structure of the sample surface. For example, the non-planarity of a sample may increase by placing the sample on the stage. According to methods described herein, accurate dimensional measurements can be conducted for planar or non-planar samples even if placed on a not perfectly planar stage surface of a stage 20.

Large-area samples having a surface area of 1 m$^2$ or more, particularly 2 m$^2$ or more can be inspected with the charged particle beam device 100 described herein.

A surface region of the sample may be inspected, e.g. for performing one or more of defect review, metrology and inspection of features of the sample, and/or measurements, such as critical dimension measurements.

Regular process control may be beneficial in the production of flat panels, displays, OLED devices such as OLED screens, TFT based substrates and other samples including a plurality of electronic or optoelectronic devices formed thereon, including but not limited to LTPS review. Process control may include regular monitoring, imaging and/or inspection of certain critical dimensions as well as defect review.

According to embodiments described herein, a charged particle beam device for inspecting a sample is provided. The charged particle beam device includes a charged particle source configured to emit a charged particle beam and an objective lens configured to focus the charged particle beam propagating along an optical axis on the sample with a focusing strength value. A controller configured to operate the charged particle beam device is provided. For example, the controller can adjust the focusing strength value according to a method of any of claims 1 to 12. The controller may include the processing unit, the calculation unit and/or the adjusting unit. One or more of these units may be integrated with each other.

The controller may include a central processing unit (CPU), a memory and, for example, support circuits. To facilitate control of the charged particle beam device, the CPU may be one of any form of general purpose computer processor that can be used in an industrial setting for controlling various components and sub-processors. The memory is coupled to the CPU. The memory, or a computer readable medium, may be one or more readily available memory devices such as random access memory, read only memory, floppy disk, hard disk, or any other form of digital storage either local or remote. The support circuits may be coupled to the CPU for supporting the processor in a conventional manner. These circuits include cache, power supplies, clock circuits, input/output circuitry and related subsystems, and the like. Inspecting process instructions and/or instructions for generating a notch in an electronic device provided on the substrate are generally stored in the memory as a software routine typically known as a recipe. The software routine may also be stored and/or executed by a second CPU that is remotely located from the hardware being controlled by the CPU. The software routine, when executed by CPU, transforms the general purpose computer into a specific purpose computer (controller) that controls the charged particle beam device can operate an automated focusing routine of focusing an electron beam (a charged particle beam, in general) according to any of the embodiments of the present disclosure. Although the method and/or process of the present disclosure is discussed as being implemented as a software routine, some of the method operations that are disclosed therein may be performed in hardware as well as by the software controller. As such, the embodiments may be implemented in software as executed upon a computer system, and hardware as an application specific integrated circuit or other type of hardware implementation, or a combination of software and hardware. The controller may execute or perform a method of automatically focusing a charged particle beam on a surface region of a sample, for example, for display manufacturing, according to embodiments of the present disclosure and/or a method of calculating a converging set of sharpness values of images of a charged particle beam device.

According to embodiments described herein, the methods of the present disclosure can be conducted using computer programs, software, computer software products and the interrelated controllers, which can have a CPU, a memory, a user interface, and input and output devices being in communication with the corresponding components of the apparatus.

Embodiments of the present disclosure allow for improvements of the autofocus in an SEM, wherein a high success rate and reduced time for the autofocus are provided.

While the foregoing is directed to some embodiments, other and further embodiments may be devised without departing from the basic scope thereof, and the scope thereof is determined by the claims that follow.

The invention claimed is:

1. A method of focusing a charged particle beam on a surface region of a sample, comprising:
   calculating a first sharpness value of a first image, wherein the first sharpness value is calculated with a sharpness function including a sum in a frequency space;
   determining a second focusing strength value based on the calculated first sharpness value and based on a golden ratio or Fibonacci numbers; and
   acquiring a second image for the second focusing strength value.

2. The method of claim 1, wherein:
   the first image is an image of a plurality of images and is for a first focusing strength value;
   the first focusing strength value and the second focusing strength value are focusing strength values of a plurality of focusing strength values; and the first sharpness value is a sharpness value of a plurality of sharpness values, and wherein a subsequent focusing strength value of the plurality of focusing strength values is based on four previous sharpness values of the plurality of sharpness values.

3. The method of claim 2, wherein the plurality of focusing strength values are provided by one or more parameters of a charged particle beam device.

4. The method of claim 1, wherein the sharpness function calculates the sharpness value based on a Fourier transform of an image.

5. The method of claim 4, wherein the sharpness function calculates the sharpness value based on a discrete Fourier transform of the image.

6. The method of claim 4, wherein the Fourier transform is filtered with a filter in the frequency space.

7. The method of claim 6, wherein the filter is a bandpass filter.

8. The method of claim 4, wherein the sharpness function is based on a limited range Discrete Fourier transform.

9. The method of claim 1, wherein a number of iterations of the golden ratio or the Fibonacci numbers is predetermined by a starting range of focusing strength values and a focusing strength accuracy.

10. The method of claim 1, further comprising:
controlling a start of scan deflectors at a predetermined starting time after determining the second focusing strength value and before acquiring the second image for the second focusing strength value.

11. The method of claim 10, wherein the predetermined starting time is varied for acquiring at least a further image.

12. A method of calculating a converging set of sharpness values of images of a charged particle beam device, comprising:
providing a first focusing strength range and a focusing strength accuracy as input parameters to a convergence algorithm;
calculating a first focusing strength value based on a golden ratio or Fibonacci numbers and depending on the first focusing strength range;
calculating a second focusing strength value based on a golden ratio or Fibonacci numbers;
imaging a sample with the first focusing strength value and the second focusing strength value to obtain images;
calculating sharpness values from the images with a sharpness function, wherein the sharpness function is based on at least one of a Fourier transform of an image or a sum in a frequency space;
determining a second focusing strength range narrower than the first focusing strength range based on the sharpness values; and
iteratively replacing the first focusing strength range with the second focusing strength range and imaging the sample to obtain further images and calculating further sharpness values from the further images.

13. The method of claim 12, wherein:
the first focusing strength range is provided by a first lower focusing strength value and a first upper focusing strength value; and
wherein iteratively replacing the first focusing strength range with the second focusing strength range includes replacing one of the first lower focusing strength value or the first upper focusing strength value with a neighboring focusing strength value selected from the first focusing strength value or the second focusing strength value.

14. The method of claim 13, providing the first lower focusing strength value or the first upper focusing strength value based on the sharpness values as an output after a predetermined number of iterations.

15. The method of claim 12, wherein the second focusing strength value is calculated depending on the first focusing strength range and the first focusing strength value.

16. A charged particle beam device for imaging a sample, comprising:
a charged particle source configured to emit a charged particle beam;
an objective lens configured to focus the charged particle beam propagating along an optical axis on the sample with a focusing strength value; and
a controller configured to adjust the focusing strength value according to a method of focusing the charged particle beam on a surface region of the sample, comprising:
calculating a first sharpness value of a first image, wherein the first sharpness value is calculated with a sharpness function including a sum in a frequency space;
determining a second focusing strength value based on the calculated first sharpness value and based on a golden ratio or Fibonacci numbers; and
acquiring a second image for the second focusing strength value.

17. The charged particle beam device of claim 16, wherein the sample is provided on a large area substrate.

18. The charged particle beam device of claim 17, wherein the sample is provided on the large area substrate for electron beam review of a surface portion of the sample during display manufacturing.

19. The charged particle beam device of claim 16, wherein the sample is a wafer for semiconductor manufacturing.

20. The charged particle beam device of claim 19, wherein the charged particle beam device is an EBI tool having two or more charged particle beams.

21. The charged particle beam device of claim 16, wherein the charged particle beam device is configured to cover a focal range up to a few hundred μm.

22. A charged particle beam device for imaging a sample, comprising:
a charged particle source configured to emit a charged particle beam;
an objective lens configured to focus the charged particle beam propagating along an optical axis on the sample with a focusing strength value; and
a controller configured to adjust the focusing strength value according to a method of calculating a converging set of sharpness values of images of a charged particle beam device, comprising:
providing a first focusing strength range and a focusing strength accuracy as input parameters to a convergence algorithm;
calculating a first focusing strength value based on a golden ratio or Fibonacci numbers and depending on the first focusing strength range;
calculating a second focusing strength value based on a golden ratio or Fibonacci numbers;
imaging a sample with the first focusing strength value and the second focusing strength value to obtain images;
calculating sharpness values from the images with a sharpness function, wherein the sharpness function includes a Fourier transform of an image and/or wherein the sharpness function is provided as a sum in a frequency space;

determining a second focusing strength range narrower than the first focusing strength range based on the sharpness values; and iteratively replacing the first focusing strength range with the second focusing strength range and imaging the sample to obtain further images and calculating further sharpness values from the further images.

* * * * *